(12) United States Patent
Huber (10) Patent No.: US 7,682,044 B2
(45) Date of Patent: Mar. 23, 2010

(54) SLIDE CONTROLLER FOR AN AUDIO-MIXER

(75) Inventor: Robert Huber, Unterengstringen (CH)

(73) Assignee: Studer Professional Audio GmbH, Regensdorf (CH)

( * ) Notice: Subject to any disclaimer, the term of this patent is extended or adjusted under 35 U.S.C. 154(b) by 525 days.

(21) Appl. No.: 10/568,791

(22) PCT Filed: Aug. 11, 2004

(86) PCT No.: PCT/CH2004/000500

§ 371 (c)(1),
(2), (4) Date: Jul. 12, 2007

(87) PCT Pub. No.: WO2005/020485

PCT Pub. Date: Mar. 3, 2005

(65) Prior Publication Data
US 2007/0274062 A1    Nov. 29, 2007

(30) Foreign Application Priority Data

Aug. 21, 2003   (CH) .................................... 1428/03

(51) Int. Cl.
*F21V 33/00*    (2006.01)

(52) U.S. Cl. .......................... 362/253; 362/551; 362/85
(58) Field of Classification Search ................. 362/253, 362/85, 551–582; 381/98, 58
See application file for complete search history.

(56) References Cited

U.S. PATENT DOCUMENTS

| 4,130,080 A |   | 12/1978 | Lotz |         |
|-------------|---|---------|------|---------|
| 4,464,781 A | * | 8/1984  | Kaneko et al. | 381/12 |
| 4,534,057 A | * | 8/1985  | Miyata et al. | 381/58 |

FOREIGN PATENT DOCUMENTS

| DE | 33 22 414 A1 | 10/1983 |
| DE | 34 11 302 A1 | 10/1985 |
| WO | WO 98 28760 A2 | 7/1998 |

\* cited by examiner

*Primary Examiner*—Bao Q Truong (57) ABSTRACT

The invention relates to a slide control for an audio mixer, whereby a slide can be displaced along a defined path in a slit-shaped opening in a front plate. The aim of the invention is to create one such slide control that clearly indicates the function it is carrying out or the parameters it can influence by its position. To this end, an illuminable element is provided, said element extending along the opening.

11 Claims, 3 Drawing Sheets

SLIDE CONTROLLER FOR AN AUDIO-MIXER

PRIORITY CLAIM

This application claims the benefit of priority from PCT Application Number PCT/CH2004/000500, which claims priority to Switzerland Application Number CH 1428/03, filed Aug. 21, 2003, both of which are incorporated by reference.

BACKGROUND OF THE INVENTION

1. Technical Field

The present invention refers to a slide controller for an audio-mixer, in which a slide can be shifted along a limited path in a slot-like opening in a front plate.

2. Related Art

In modern, digitally operating audio mixers for audio signals it is common that one single slide controller may influence several functions or parameters. Thus, at least one selector key or one equivalent element is associated to such a slide controller, wherein the desired function or the desired parameter may be selected by this element. If this has taken place, the slide controller may be shifted manually or by a motor drive to the desired position, wherein the desired effect sets in. However, the problem frequently occurs that the operating person shall also know after a certain period of time which function or which parameter the selected slide currently influences. For this purpose it is known to integrate a display into a key by which the slide controller is operated for instance manually in a known manner. This may be implemented in that an illumination element is accommodated in the key and the key consists of translucent or transparent material. Thus, the key shall flash in different colors, depending on the function that it currently performs or influences. If the mixer is equipped with a screen, a display can also be made thereon, which indicates which function or which parameters the selected slide controller currently influences.

These known solutions reveal the disadvantage that the illumination of the keys of the slide controllers is constrictively complex and is expensive in production. This is caused by the fact that the supply for the illumination in the movable part of the slide controller must be ensured. Moreover, it has often proven during practical use that the illumination of the keys is often too weak or is not sufficiently noticeable, since the keys project from the front plate and can also be illuminated by other light sources. If the selected function is displayed on the screen, this screen is usually more or less remote from the respective slide controller so that the eye of the operating person must also move back and forth. One has to take into consideration that modern mixers also comprise dozens of slide controllers also in the case of multiple occupation and thus a confusion is very likely to occur.

SUMMARY

Thus, it is an object of the invention, as it is characterized in the patent claims, to provide such a slide controller, which does not reveal the mentioned disadvantages and which clearly indicates which function it performs or which parameter it may influence by its position.

This is implemented according to the invention in that an illuminable element is provided longitudinally next to or preferably in the slot-shaped opening, in which the slide can be shifted along a limited path in the front plate, said illuminable element extending in parallel to the opening. The illuminable element appears as a luminous elongate strip when looking onto the front plate, said strip extending in parallel to the path of the slide. The luminous strip may be continuous or it may be divided into sections. The illuminable element consists of a light conductor and a light source, which may preferably emit multi-colored light. A multi-color light emitting diode is preferably provided as a light source. The illuminable element is connected to a selector key or a selector key field through a light conductor and a light source, by means of which said selector key or selector key field the desired function or the parameter searched for can be selected. The selector key for selecting at least one function is connected to the light source for the illuminable element such that the light source is controlled such that a certain color for the light from the light source is associated to the respective function or the respective parameter. One selector key each can be provided for each function and one independent color for the light from the illuminable element may be associated for each function.

The advantages achieved by the invention are particularly to be seen in that it is easier to the operating person of the mixer to clearly recognize which predetermined slide controller is currently connected to which function or which parameter is may currently influence in the present position of the keys in the selector key field. By the provided type of illumination it is possible in a more simple way to also correctly perceive the color of the luminous strip in the slide controller also when the ambient light is bright. Since the key or knob of the slide controller, which shall be shifted by the hand of the operating person, covers part of the luminous strip, the operating person easily recognizes in which position the key or the knob is currently located along the opening. Thus, the work with several slide controllers, which carry out several functions or which may influence several parameters, is significantly facilitated so that less mis-operations must be expected.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
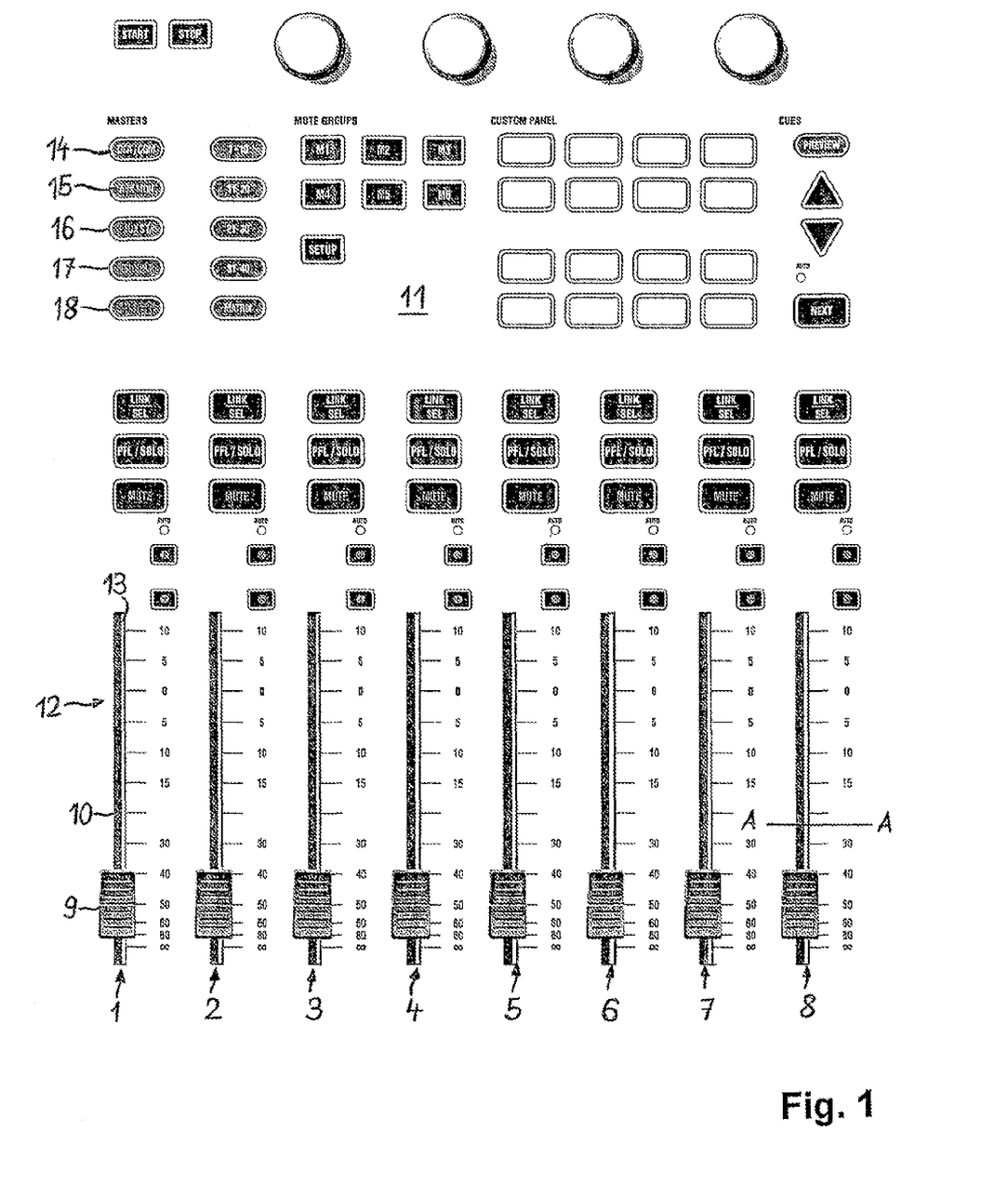
FIG. 1 is a top plan view onto a part of an audio-mixer with several slide controllers.

FIG. 1 shows a top plan view onto a part of an audio-mixer with several slide controllers 1 to 8. A slide 9, which in this case comprises a knob or a key, may be shifted in a slot-shaped opening 10 in a front plate 11 of an audio-mixer along a path 12 limited by the length of the opening. An illuminable element 13 is provided in or directly next to the opening 10, said element being visible from the top and which appears as an elongate strip. Besides other keys, which are not designated any closer in this case, particularly five selector keys 14 to 18 can be recognized, wherein each selector key 14 to 18 is provided for associating at least one of the slide controllers 1 to 8 to a function which is exerted onto one or several audio signals, or to influence or adjust at least one parameter which is important in the processing of one or several audio signals.

Figure 2:
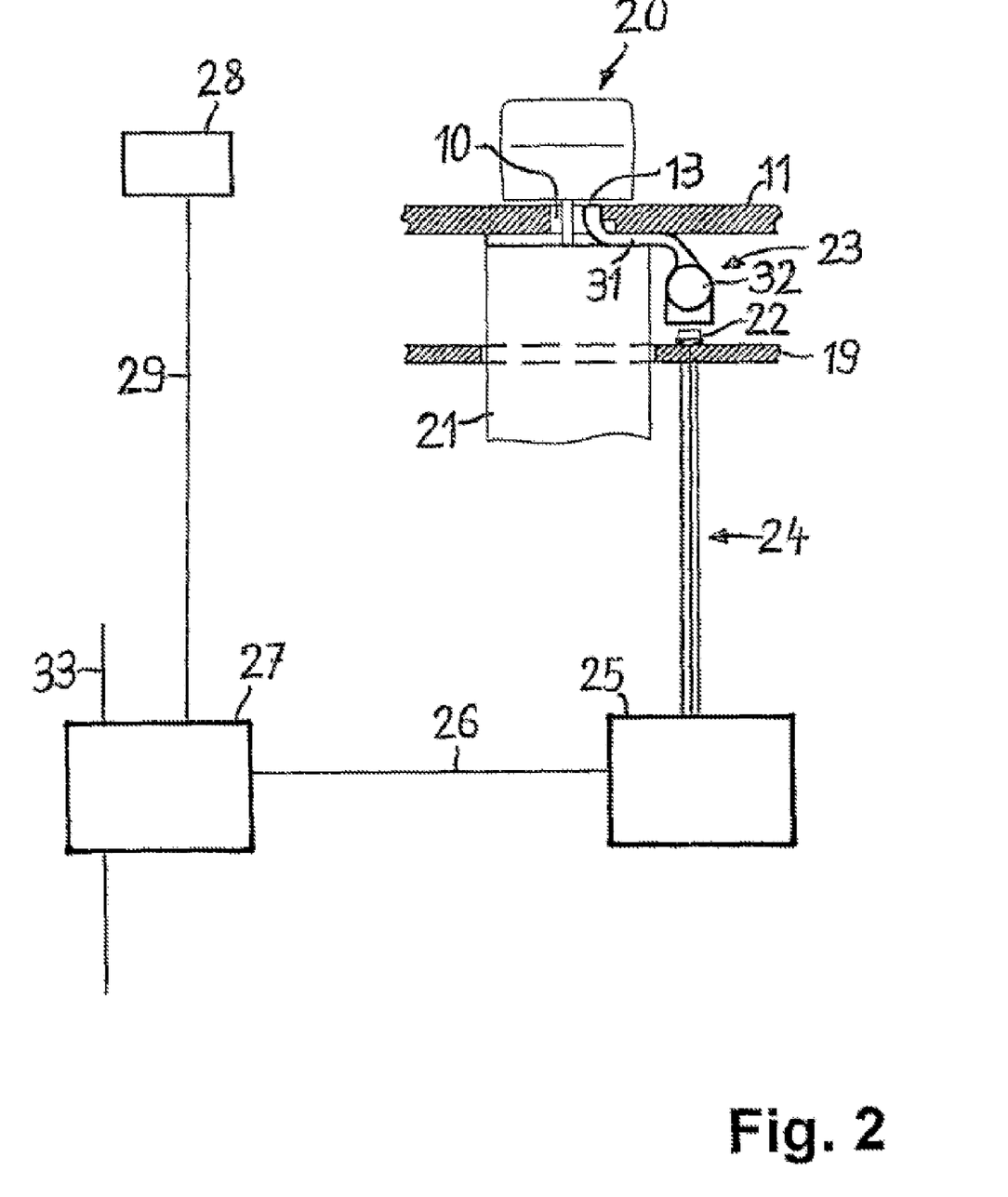
FIG. 2 is a section through a slide controller along a line A-A in FIG. 1.

FIG. 2 shows a section through a part of an audio-mixer, comprising a slide controller, wherein a front plate 11, a printed circuit board 19, a slide 20, an actuator element 21 connected to the slide 20 and operable thereby, said actuator element for instance being formed as potentiometer, a light source 22 and a light conductor 23 can be recognized. The light source 22 may be a multi-color light emitting diode and is arranged on the printed circuit board 19. It is connected to a D/A converter 25 via lines 24. This D/A converter is connected via a line 26 to a processor 27, which is connected to at least one selector key 28 via a line 29. The opening 10 with the illuminated strip 13 can be seen in the front plate 11. The light conductor 23 is preferably arranged at the front plate 11, it could, however, also be attached on the printed circuit board 19.

Figure 3:
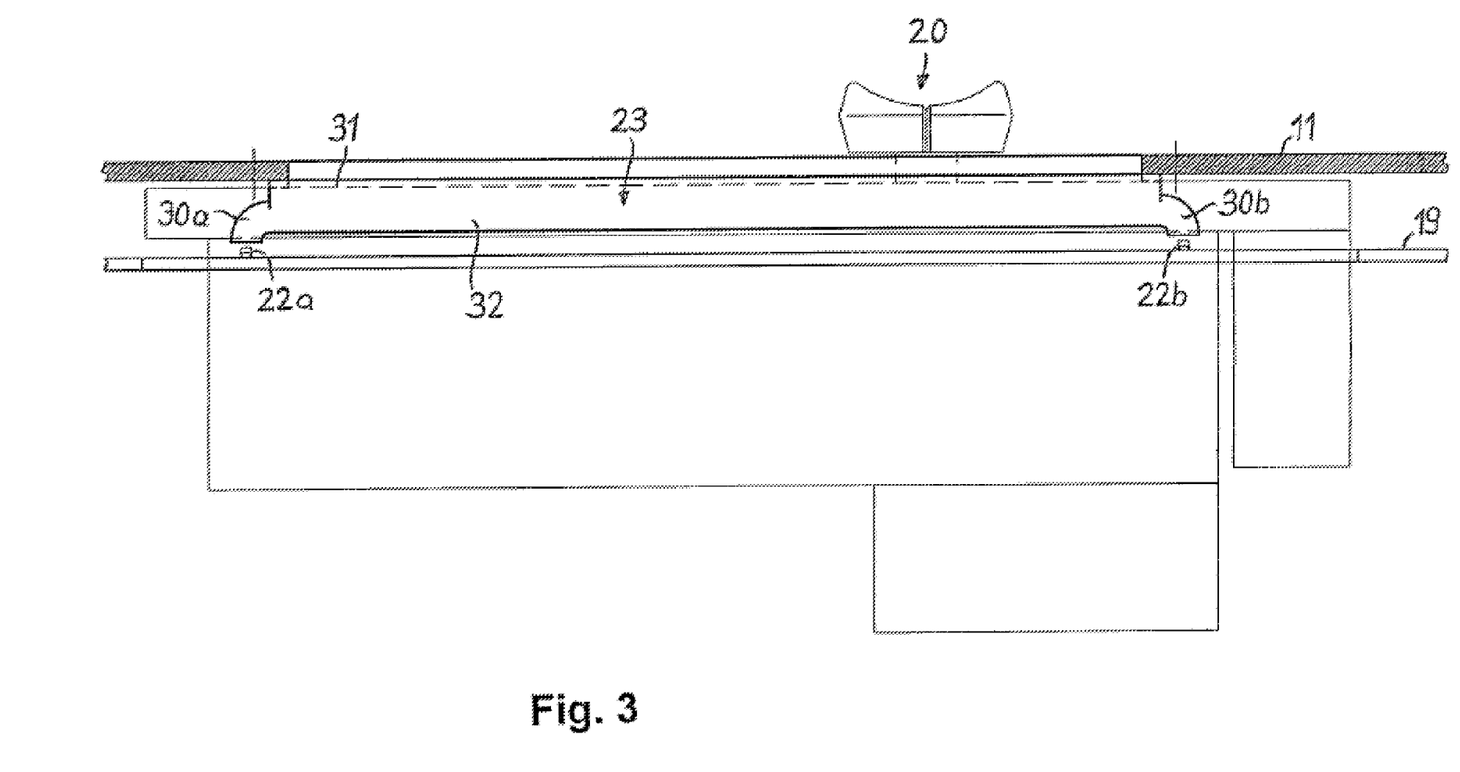
FIG. 3 is a view of a slide controller according to the invention.

FIG. 3 shows the elements already known from FIG. 2, such as particularly the slide 20, the light conductor 23 and the opening 10 in side view. It can also be recognized that preferably two light sources 22a and 22b are provided, wherein each of the light sources is arranged at an end of the light conductor 23. The light conductor 23 therefore comprises one bent light shaft 30a and 30b each on the two ends, whose object it is to deflect the light from the light sources 22a and 22b in a direction that is parallel to the opening 10.

The mode of operation of the invention is as follows:

If a function or parameter is selected by a selector key 14 to 18 (FIG. 1) or 28 (FIG. 2), for which e.g. the slide controller 1 shall take effect, this is communicated to the processor 27 via the line 29. This processor 27 may exert this function, e.g. a filtering, a mixing etc., onto an audio signal of a line 33 and at the same time control the D/A converter 25 via the line 26, said D/A converter switching on the light source 22 or the light sources 22a and 22b via the lines 24 in a manner that this light source may irradiate light with the desired color. Thus, such a light source 22 or also both light sources 22a, 22b may irradiate light in the fixedly defined color, or a desired further color may be generated from the e.g. three colors that they irradiate by a mixture of the three colors. The light always reaches through the bent light shafts 30a, 30b into the light conductor 23 or its main part 32, which is formed such that it distributes the light possibly regularly in the longitudinal direction. This may be implemented by suitable coating or other measures. The light conductor 23 may be hollow or filled or it may also consist of a bundle of light-conducting fibers. In any case, the light shall emerge across the entire length of the opening 10 into same, which is ensured by a strip-shaped end face, which is arranged next to the movement path of the slide 9, 20 and which forms the illuminable element 13. The strip-shaped end face or the illuminable element 13 is connected to the main part 32 of the light conductor 23 via the multiply bent conductor 31, as it may well be seen in FIG. 2. The distribution of the light in the longitudinal direction may be implemented at a suitable distance from the opening 10 in the main part 32. The light then changes laterally from the main part 32 into the multiply bent conductor 31, which opens into the strip-shaped, illuminable element 13. In a respective manner the color of the illuminable element 13 in the slide controller 1 can be switched-off or varied by operating a different selector key. This depends on how this slide controller 1 is used by the respective selector key for his job in the mixer.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. A slide controller for an audio mixer having a plurality of slides, in which each slide of the plurality of slides is configured to be shifted along a limited path in a slot-shaped opening in a front plate, characterized in that an illuminable element is provided that extends along the slot-shaped opening.

2. A device as claimed in claim 1, characterized in that the illuminable element appears as a luminous strip when looking onto the front plate.

3. Device as claimed in claim 1, characterized in that the illuminable element is connected to a light conductor and to a light source.

4. A device as claimed in claim 3, characterized in that the light source may emit multi-colored light.

5. A device as claimed in claim 3, characterized that a light emitting diode is provided as light source.

6. A device as claimed in claim 1, characterized in that the illuminable element is connected to a selector key through a light conductor and a light source.

7. A device as claimed in claim 3, characterized in that the light conductor is arranged at the front plate.

8. A device as claimed in claim 3, characterized in that the light source is arranged on a printed circuit board.

9. A device as claimed in claim 6, characterized in that the selector key is provided for selecting at least one function, and that the light source is controlled such that a predetermined color of light from the light source is associated to the respective function.

10. A device as claimed in claim 6, characterized in that one selector key is provided for each function of a plurality of functions and that an independent color of light from the illuminable element is provided for each function.

11. A device as claimed in claim 1, characterized in that the illuminable element is provided in the slot-shaped opening.

* * * * *

UNITED STATES PATENT AND TRADEMARK OFFICE
CERTIFICATE OF CORRECTION

PATENT NO. : 7,682,044 B2  Page 1 of 1
APPLICATION NO. : 10/568791
DATED : March 23, 2010
INVENTOR(S) : Robert Huber It is certified that error appears in the above-identified patent and that said Letters Patent is hereby corrected as shown below:

At column 1, line 22, "...associated to such..." should be changed to "...associated with such..."
At column 2, line 15, "...associated to the respective..." should be changed to "...associated with the respective..."
At column 2, line 19, "...for each function" should be changed to "...with each function."
At column 2, line 24, "...parameter is may currently influence in the present position..." should be changed to "...parameter may currently influence the present position..."
At column 2, line 28, "...controller also when the ambient light..." should be changed to "...controller even when the ambient light..."
At column 2, line 35, "...mis-operations must be..." should be changed to "...mis-operations may be..."
At column 2, line 67, "...the length of the opening" should be changed to "...the length of the opening 10."
At column 3, line 2, "...said element being visible..." should be changed to "...said element 13 being visible..."
At column 3, line 18, "This D/A converter..." should be changed to "This D/A converter 25..."
At column 3, line 41, "...said D/A converter..." should be changed to "...said D/A converter 25..."
In Claim 5, column 4, lines 35-36, "...characterized that a light emitting diode is provided as light source" should be changed to "...characterized in that a light emitting diode is provided as the light source."
In Claim 9, column 4, line 47, "...is associated to..." should be changed to "...is associated with..."

Signed and Sealed this

Fourteenth Day of December, 2010

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,682,044 C1 |
| APPLICATION NO. | : 90/012133 |
| DATED | : February 26, 2013 |
| INVENTOR(S) | : Robert C. Huber |

It is certified that error appears in the above-identified patent and that said Letters Patent is hereby corrected as shown below:

In the Specification

Column 4, line 12, delete "that" and insert therefor --than--.

Signed and Sealed this
Twenty-ninth Day of October, 2013

Teresa Stanek Rea
*Deputy Director of the United States Patent and Trademark Office*

US007682044C1

(12) EX PARTE REEXAMINATION CERTIFICATE (9531st)
United States Patent
Huber (10) Number: US 7,682,044 C1
(45) Certificate Issued: Feb. 26, 2013

(54) SLIDE CONTROLLER FOR AN AUDIO-MIXER

(75) Inventor: Robert Huber, Unterengstringen (CH)

(73) Assignee: Studer Professional Audio GmbH, Regensdorf (CH)

Reexamination Request:
No. 90/012,133, Feb. 7, 2012

Reexamination Certificate for:
Patent No.: 7,682,044
Issued: Mar. 23, 2010
Appl. No.: 10/568,791
Filed: Jul. 12, 2007

Certificate of Correction issued Dec. 14, 2010.

(21) Appl. No.: 90/012,133

(22) PCT Filed: Aug. 11, 2004

(86) PCT No.: PCT/CH2004/000500
§ 371 (c)(1),
(2), (4) Date: Jul. 12, 2007

(87) PCT Pub. No.: WO2005/020485
PCT Pub. Date: Mar. 3, 2005

(30) Foreign Application Priority Data

Aug. 21, 2003 (CH) .................................. 1428/03

(51) Int. Cl.
*F21V 33/00* (2006.01)

(52) U.S. Cl. ..................... 362/253; 362/85; 362/551

(58) Field of Classification Search .................. None
See application file for complete search history.

(56) References Cited

To view the complete listing of prior art documents cited during the proceeding for Reexamination Control Number 90/012,133, please refer to the USPTO's public Patent Application Information Retrieval (PAIR) system under the Display References tab.

*Primary Examiner* — Pia Tibbits (57) ABSTRACT

The invention relates to a slide control for an audio mixer, whereby a slide can be displaced along a defined path in a slit-shaped opening in a front plate. The aim of the invention is to create one such slide control that clearly indicates the function it is carrying out or the parameters it can influence by its position. To this end, an illuminable element is provided, said element extending along the opening.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 6, 9 and 10 is confirmed.

Claims 1 and 3 are cancelled.

Claims 2, 4, 5, 7, 8 and 11 are determined to be patentable as amended.

New claims 12-58 are added and determined to be patentable.

2. A device as claimed in claim [1] *6*, characterized in that the illuminable element appears as a luminous strip when looking onto the front plate.

4. A device as claimed in claim [3] *6*, characterized in that the light source may emit multi-colored light.

5. A device as claimed in claim [3] *6*, characterized in that a light emitting diode is provided as the light source.

7. A device as claimed in claim [3] *6*, characterized in that the light conductor is arranged at the front plate.

8. A device as claimed in claim [3] *6*, characterized in that the light source is arranged on a printed circuit board.

11. A device as claimed in claim [1] *6*, characterized in that the illuminable element is provided in the slot-shaped opening.

*12. A slide controller for an audio mixer having a plurality of slides, in which each slide of the plurality of slides is configured to be shifted along a limited path in an elongated slot-shaped opening having a length in a front plate to influence a selected function, characterized in that an illuminable element is provided in or next to each slot-shaped opening and extends along each slot-shaped opening, wherein each illuminable element is configured to emit light having one of a plurality of colors, and wherein the color is associated with the selected function.*

*13. The slide controller of claim 12 wherein each illuminable element is next to the slot-shaped opening.*

*14. The slide controller of claim 13 wherein each illuminable element is an elongated strip.*

*15. The slide controller of claim 14 wherein each illuminable element has a length approximately equal to the length of the slot-shaped opening.*

*16. The slide controller of claim 14 wherein each illuminable element is configured such that light may be emitted from an entire length of the illuminable element.*

*17. The slide controller of claim 16 wherein the elongated strip is a continuous member.*

*18. The slide controller of claim 16 wherein the elongated strip is divided into sections.*

*19. The slide controller of claim 12 wherein each illuminable element includes a strip-shaped face and a light source.*

*20. The slide controller of claim 19 wherein the illuminable element is configured such that light may be emitted from an entire length of the illuminable element.*

*21. The slide controller of claim 12 wherein each illuminable element includes a multi-color light emitting diode.*

*22. The slide controller of claim 12 wherein each illuminable element is in the slot-shaped opening.*

*23. The slide controller of claim 12 wherein a width of each slide is greater than a width of the slot-shaped opening.*

*24. The slide controller of claim 12 and further including at least one selector key coupled to the slide controllers and the illuminable elements, and operable to select the function influenced by the slides.*

*25. The slide controller of claim 24 wherein each selector key is spaced from the slide controllers on the front plate.*

*26. The slide controller of claim 24 and further including a microprocessor coupling each selector key to the slide controllers.*

*27. A slide controller for an audio mixer having a plurality of slides and a selector key for associating a slide of at least one of the slide controllers to a function, in which each slide of the plurality of slides is configured to be shifted along a limited path in an elongated slot-shaped opening having a length in a front plate to control the function associated with the slide by the selector key, characterized in that an elongated strip-shaped illuminable element is provided in or next to each slot-shaped opening and extends along the slot-shaped opening, wherein each illuminable element includes a light source configured to emit light having one of a plurality of colors of light, and wherein the color of light emitted is associated with the function.*

*28. The slide controller of claim 27 wherein each illuminable element is next to the slot-shaped opening.*

*29. The slide controller of claim 28 wherein each illuminable element is parallel to the slot-shaped opening.*

*30. The slide controller of claim 29 wherein each illuminable element has a length approximately equal to the length of the slot-shaped opening.*

*31. The slide controller of claim 27 wherein each illuminable element has a length approximately equal to the length of the slot-shaped opening.*

*32. The slide controller of claim 27 wherein each illuminable element is configured such that light may be emitted from an entire length of the illuminable element.*

*33. The slide controller of claim 27 wherein the light source includes a multicolor light emitting diode.*

*34. The slide controller of claim 27 wherein each illuminable element is in the slot-shaped opening.*

*35. The slide controller of claim 27 wherein each illuminable element is parallel to the slot-shaped opening.*

*36. An audio mixer, comprising:*
*a front plate;*
*a plurality of slide controllers, each slide controller including a slide configured to be shifted along a limited path in an elongated slot-shaped opening having a length in the front plate;*
*a selector key configured to allow an operator to select a function that is associated to the slide controllers; and*
*a plurality of elongated, strip-shaped illuminable elements, wherein each of the illuminable elements is provided in or next to one of the slot shaped openings and extends along the slot-shaped opening, and wherein each illuminable element includes a light source coupled to the selector key, the light source configured to emit light having one of a plurality of colors, wherein the color is associated with the selected function.*

*37. The audio mixer of claim 36 wherein each illuminable element is next to the slot-shaped opening.*

38. The audio mixer of claim 37 wherein each illuminable element has a length approximately equal to the length of the slot-shaped opening.

39. The audio mixer of claim 36 wherein each illuminable element has a length approximately equal to the length of the slot-shaped opening.

40. The audio mixer of claim 36 wherein the light source is configured such that light may be emitted from an entire length of the illuminable element.

41. The audio mixer of claim 36 wherein the light source includes a multicolor light emitting diode.

42. The audio mixer of claim 36 wherein each illuminable element is in the slot-shaped opening.

43. The audio mixer of claim 36 wherein a width of each slide is greater than a width of the slot-shaped opening.

44. The audio mixer of claim 43 wherein each illuminable element is parallel to the slot-shaped opening.

45. The audio mixer of claim 36 wherein each illuminable element is parallel to the slot-shaped opening.

46. An audio mixer, comprising:
   a front plate including a plurality of elongated, slot-shaped openings, each of the elongated, slot-shaped openings having a length and a width;
   a plurality of slides, each slide configured to be shifted along a limited path in the corresponding elongated, slot-shaped opening;
   at least one selector key configured to allow an operator to select a function that is associated to the slide controllers;
   a plurality of elongated, illuminable elements positioned in or next to one of the plurality of elongated, slot-shaped openings, wherein each of the elongated, illuminable elements extends along the slot-shaped opening, and wherein each illuminable element includes a light source; and
   a controller configured for causing the light source to emit light having a color associated with the selected function.

47. The audio mixer of claim 46 wherein each of the illuminable elements extends along and parallel to one of the plurality of elongated, slot-shaped openings.

48. The audio mixer of claim 47 wherein each of the plurality of slides is configured to move along a path substantially parallel to the corresponding illuminable element.

49. The audio mixer of claim 48 wherein each of the plurality of slides includes a knob, the knob having a width such that the knob extends fully across the width of the corresponding elongated, slot-shaped opening.

50. The audio mixer of claim 49 wherein the width of each knob is greater that the width of the corresponding elongated, slot-shaped opening.

51. The audio mixer of claim 50 wherein each illuminable element has a length approximately equal to the length of the slot-shaped opening.

52. The audio mixer of claim 51 wherein each illuminable element is configured to emit light from an entire length of the illuminable element.

53. The audio mixer of claim 52 wherein each of the plurality of elongated, illuminable elements is configured to emit light having one of a plurality of colors, each such color associated with a selected function.

54. The audio mixer of claim 46 wherein each of the plurality of elongated, illuminable elements is configured to emit light having one of a plurality of colors, each such color associated with a selected function.

55. The audio mixer of claim 54 wherein each of the slides has a width that is greater than the width of the slot-shaped opening.

56. The audio mixer of claim 55 wherein each illuminable element has a length approximately equal to the length of the slot-shaped opening.

57. The audio mixer of claim 56 wherein each illuminable element is configured to emit light from an entire length of the illuminable element.

58. The audio mixer of claim 57 wherein the light source is a multi-color light emitting diode.

\* \* \* \* \*